(12) United States Patent
Fan et al.

(10) Patent No.: US 9,761,695 B1
(45) Date of Patent: Sep. 12, 2017

(54) METHOD FOR FABRICATING A SHIELD GATE TRENCH MOSFET

(71) Applicant: SHANGHAI HUAHONG GRACE SEMICONDUCTOR MANUFACTURING CORPORATION, Shanghai (CN)

(72) Inventors: Rangxuan Fan, Shanghai (CN); Jinzheng Miao, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 15/363,138

(22) Filed: Nov. 29, 2016

(30) Foreign Application Priority Data

May 31, 2016 (CN) .......................... 2016 1 0373504

(51) Int. Cl.
| | |
|---|---|
| *H01L 29/08* | (2006.01) |
| *H01L 29/66* | (2006.01) |
| *H01L 29/423* | (2006.01) |
| *H01L 29/06* | (2006.01) |
| *H01L 21/308* | (2006.01) |
| *H01L 21/306* | (2006.01) |
| *H01L 21/283* | (2006.01) |
| *H01L 21/324* | (2006.01) |

(52) U.S. Cl.
CPC ...... *H01L 29/66666* (2013.01); *H01L 21/283* (2013.01); *H01L 21/3085* (2013.01); *H01L 21/30604* (2013.01); *H01L 21/324* (2013.01); *H01L 29/0642* (2013.01); *H01L 29/4236* (2013.01)

(58) Field of Classification Search
CPC ............ H01L 29/1095; H01L 29/4236; H01L 29/66734; H01L 29/7813; H01L 29/407
See application file for complete search history.

(56) References Cited

U.S. PATENT DOCUMENTS

| | | | |
|---|---|---|---|
| 2006/0273386 A1* | 12/2006 | Yilmaz ............... | H01L 29/7827 257/330 |
| 2007/0158701 A1* | 7/2007 | Chang ............... | H01L 21/76232 257/288 |
| 2011/0220990 A1* | 9/2011 | Chang ................... | H01L 29/402 257/330 |

(Continued)

*Primary Examiner* — Jaehwan Oh
(74) *Attorney, Agent, or Firm* — MKG LLC

(57) ABSTRACT

A method for fabricating a shield gate trench MOSFET, including the following steps: forming a hard mask layer and defining a gate forming region; forming a top trench by means of both anisotropic and isotropic etching; forming an oxidative barrier layer; etching back the oxidative barrier layer, and then forming a bottom trench by means of anisotropic etching; forming a bottom oxidative layer by means of thermal oxidative self-alignment; removing the oxidative barrier layer; forming a gate dielectric film; forming a first polysilicon layer; etching back the first polysilicon layer to form respectively therefrom a polysilicon gate and a bottom shield polysilicon; forming a inter-poly dielectric isolation layer; etching back the inter-poly dielectric isolation layer; forming a second polysilicon layer and forming a shield polysilicon by means of superposition with the bottom shield polysilicon.

10 Claims, 15 Drawing Sheets

(56) References Cited

U.S. PATENT DOCUMENTS

| | | | | |
|---|---|---|---|---|
| 2014/0124855 A1* | 5/2014 | Hebert | ................ | H01L 29/7813 257/334 |
| 2014/0361349 A1* | 12/2014 | Alexandrov | ........ | H01L 29/8083 257/263 |
| 2015/0349091 A1* | 12/2015 | Yilmaz | ............. | H01L 29/66666 438/270 |
| 2015/0372131 A1* | 12/2015 | Hebert | ................ | H01L 29/7813 257/330 |
| 2016/0197176 A1* | 7/2016 | Stefanov | ............... | H01L 29/404 257/334 |
| 2017/0098695 A1* | 4/2017 | Chen | ................... | H01L 29/4236 |
| 2017/0110535 A1* | 4/2017 | Yilmaz | ............... | H01L 21/2253 |

* cited by examiner

METHOD FOR FABRICATING A SHIELD GATE TRENCH MOSFET

CROSS REFERENCE TO RELATED APPLICATION

The present application claims priority to Chinese Patent Application No. 201610373504.7 filed on May 31, 2016, the entirety of which is incorporated by reference herein.

FIELD OF THE INVENTION

The present invention relates to a semiconductor integrated circuit fabricating method, and relates in particular to a method for fabricating a shield gate trench (SGT) metal-oxide semiconductor field-effect transistor (MOSFET).

BACKGROUND ART

FIGS. 1A to 1N show structures of related components in steps of a method of prior art for fabricating a shield gate trench MOSFET, wherein a bottom up methodology is adopted to form a trench detached gate structure with a shield gate, via the following steps:

Step one: as is shown on FIG. 1A, providing a semiconductor substrate 101, such as a silicon substrate; forming a hard mask layer 102 on a surface of the semiconductor substrate 101, the hard mask layer adopting an oxidative layer or an oxidative layer plus a nitride layer.

Subsequently, as is shown on FIG. 1B, etching the hard mask layer 102 by means of lithography to define a gate forming region, and etching the semiconductor substrate 101 with the hard mask layer as a mask to form a trench 103.

Step two: forming an oxidative layer 104 on a side and a bottom of the trench 103, as is shown on FIG. 1C.

Step three: filling in an source polysilicon 105 in the trench 103, as is shown on FIG. 1D, the source polysilicon 105 being a shield polysilicon and being generally connected with a source to form a shield gate.

Step four: etching back the source polysilicon 105, as is shown on FIG. 1E, to remove the source polysilicon 105 outside of the trench 103, with a top of the source polysilicon 105 inside of the trench 103 being level with the semiconductor substrate 101.

Removing the oxidative layer 104 on a top of the trench 103, as is shown on FIG. 1F.

Step five: conducting thermal oxidation and forming at the same time a gate oxide 106a and a inter-poly dielectric isolation layer 106b, as is shown on FIG. 1G.

Forming a polysilicon gate 107, which being a trench gate, as is shown on FIG. 1H.

Etching back the polysilicon gate 107 rendering the polysilicon gate 107 only remain on two sides of the source polysilicon 105 on the top of the trench 103, as is shown on FIG. 1I; it can be instantly seen that the polysilicon gate 107 on the two sides of the trench 103 are detached and such a detached trench gate forming on the side walls of a trench is referred to as a trench detached side gate, as is opposed to a trench gate composed of a polysilicon gate completely filled in on the top of the trench.

Step six: forming a well region 108 and a source region 109, as is shown on Figure H.

Forming an interlayer film 110 and a contact hole 111a corresponding to a structure previous to filling of metals, as is shown on FIG. 1J. Preferably, subsequent to the etching and forming of the contact hole 111a, a well region contact region needs to be formed at a bottom of the contact hole 111a corresponding to a top of the source region 109.

Subsequently filling the metals in the contact hole 111a to transform the contact hole 111a to a contact hole 111, as is shown on FIG. 1K.

Forming a positive metal layer 112, as is shown on FIG. 1L.

Patternizing the positive metal layer 112 by means of lithographic etching to form a source pole and a gate pole, as is shown on FIG. 1M, wherein the source pole is in contact with the source region 109 at the bottom, the well region contact region, and the source polysilicon 105 via the contact hole, and the gate pole is in contact with the polysilicon gate 107 via the contact hole.

Subsequently forming a drain region and a reverse metal layer 113 on a reverse side of the semiconductor substrate 101, and a drain pole comprised of the reverse metal layer 113, as is shown on FIG. 1N.

In the prior art process, a side of the polysilicon gate 107 is detached from the well region 108 via the gate oxide 106a, while a surface of the well region covered by the side of the polysilicon gate 107 is employed to form a channel. As is exemplified by FIG. 1N, the polysilicon gate 107 formed by the aforementioned process only appears on the side walls on the top of the trench, and such a vertical device with a side wall polysilicon structure increases operation current; at the same time, the source polysilicon 105, which being filled in the entire trench, and having good shield effect and relatively small bottom capacitance, reduces input capacitance from source drain and gate drain and improves frequency characteristics.

As can be inferred from the above, the aforementioned polysilicon gate with a side wall polysilicon structure is a trench gate MOSFET with a detached side gate structure having a shield gate, and is also named as a shield gate trench MOSFET with both a left and right structure, and is fabricated in prior art with a bottom up technique. As is shown on FIG. 1G, the gate oxide 106a and a spacer layer of the shield gate, i.e., the inter-poly dielectric isolation layer 106b are formed at the same time, and hence a spacing level between the trench gate, i.e., the polysilicon gate 107 and the shield gate, i.e., the source polysilicon 105 is determined by the gate oxide 106a, restricting application of the structure in low threshold electric appliances, as a thin gate oxide 106a easily results in gate-source current leakage. In conclusion, a low threshold electric appliance requires a thin gate oxide 106a, while a thin gate oxide 106a reduces thickness of the inter-poly dielectric isolation layer 106b, resulting in gate-source current leakage, that is to say, the prior art technique is unable to resolve the conflict between a reduced threshold voltage and a reduced gate-source current leakage.

SUMMARY OF THE INVENTION

A technical problem the present invention aims to solve is to provide a method for fabricating a shield gate trench MOSFET which reduces threshold voltage and gate-source current leakage of an appliance at the same time.

To solve the aforementioned technical problem, a gate structure for the method for fabricating the shield gate trench MOSFET provided by the present invention is formed via the following steps:

Step one: providing a semiconductor substrate, forming a hard mask layer on a surface of the semiconductor substrate, defining a gate forming region by means of lithography, and removing the hard mask layer in the gate forming region by means of etching.

Step two: with the etched hard mask layer as a mask, conducting a first etching, which being an anisotropic one, on the semiconductor substrate to form a top trench, and subsequently conducting a second etching, which being an isotropic one, on the semiconductor substrate, to render a width of the top trench to be greater than an opening width defined by the hard mask layer.

Step three: forming an oxidative barrier layer on an inner side surface of the top trench, and extending the oxidative barrier layer to a surface of the hard mask layer exterior to the top trench.

Step four: etching back the oxidative barrier layer to remove the oxidative barrier layer on a surface of a bottom of the top trench and on the surface of the hard mask layer, with the oxidative barrier layer on the side surface of the top trench remaining intact.

With the hard mask layer as a mask, conducting a third etching, which being an anisotropic one, on the semiconductor substrate on the bottom of the top trench to form a bottom trench.

Step five: conducting thermal oxidation on a bottom surface and a side surface of the bottom trench to form a bottom oxidative layer by means of self-alignment, with the oxidative barrier layer protecting the semiconductor substrate on the side surface of the top trench during the entire process of the thermal oxidation of the bottom oxidative layer.

Step six: removing the oxidative barrier layer.

Step seven: forming a gate dielectric film on the side surface of the top trench.

Step eight: conducting a first polysilicon growth to form a first polysilicon layer for completely filling in the bottom trench formed with the bottom oxidative layer, the first polysilicon layer in the top trench being situated in a side surface of the gate dielectric film, with the first polysilicon layer respectively on either side of the top trench having a distance one with another, and the first polysilicon layer being extended to the surface of the hard mask layer exterior to the top trench.

Step nine: conducting an etchback on the first polysilicon layer, with the etchback rendering the first polysilicon layer on the bottom trench to be lower than a top of the bottom oxidative layer and removing at the same time the first polysilicon layer exterior to the top trench, the portion of the first polysilicon layer on either side of the top trench subsequent to the etchback constituting a polysilicon gate, and the first polysilicon layer filling in the bottom trench subsequent to the etchback constituting a bottom shield polysilicon.

Step ten: forming a inter-poly dielectric isolation layer which is formed on a side surface of the polysilicon gate and on a surface of the bottom shield polysilicon and is extended to the surface of the hard mask layer exterior to the top trench.

Step eleven: etching back the inter-poly dielectric isolation layer for removing the inter-poly dielectric isolation layer on the surface of the bottom shield polysilicon.

Step twelve: conducting a second polysilicon growth to form a second polysilicon layer which completely fills in the top trench in a top of the bottom shield polysilicon and constitutes a top shield polysilicon, and the top shield polysilicon and the bottom shield polysilicon are in contact with one another and constitute a shield polysilicon.

As a further improvement, the method, subsequent to forming the gate structure, further comprises the following steps:

Step thirteen: removing the second polysilicon layer, the inter-poly dielectric isolation layer, and the hard mask layer exterior to the top trench, and exposing the surface of the semiconductor substrate.

Step fourteen: injecting ions to form a well region in the semiconductor substrate; conducting heavily doped source ion implantation to form a source region on a surface of the well region; conducting thermal annealing on the well region and the source region.

Step fifteen: forming an interlayer film, a contact hole and a positive metal layer on a positive side of the semiconductor substrate, etching the positive metal layer to form a source pole and a gate pole, the source pole being in contact with the source region and the shield polysilicon via the contact hole, and the gate pole being in contact with the polysilicon gate via the contact hole.

Step sixteen: thinning a reverse side of the semiconductor substrate, forming a heavily doped drain region, and forming a reverse metal layer on a reverse side of the drain region as a drain pole.

As a further improvement, the semiconductor substrate is a silicon substrate, with a silicon epilayer being formed on a surface of the silicon substrate, and the top trench and the bottom trench are all situated inside the silicon epilayer.

As a further improvement, the hard mask layer in step one is composed of an oxidative layer.

As a further improvement, the oxidative barrier layer in step three is composed of a first oxidative layer and a second nitride layer being successively superposed.

As a further improvement, the gate dielectric film in step seven is a gate oxide.

As a further improvement, the gate oxide is formed by means of thermal oxidation.

As a further improvement, the inter-poly dielectric isolation layer in step ten is composed of another oxidative layer.

As a further improvement, the inter-poly dielectric isolation layer is formed by means of thermal oxidation.

As a further improvement, step fifteen, subsequent to forming an opening of the contact hole and prior to filling in a metal, further comprises a step of forming a well region contact region by means of heavy doping implantation on a bottom of the contact hole in contact with the source region.

The gate structure of the present invention is formed via a top-down process, with the gate dielectric film on the top of the side surface of the top trench being first formed, with the polysilicon gate and the bottom shield polysilicon subsequently formed simultaneously by means of the same polysilicon deposition and etchback technique, and finally the inter-poly dielectric isolation layer is independently formed on the side surface of the polysilicon gate. Thus it can be readily seen that the gate dielectric film and the inter-poly dielectric isolation layer of the present invention are separately formed, and therefore the thickness of the gate dielectric film and that of the inter-poly dielectric isolation layer are independent from each other. And hence the present invention is able to reduce the thickness of the gate dielectric film to obtain a low threshold voltage appliance, and is also able at the same time to increase the thickness of the inter-poly dielectric isolation layer to reduce gate-source current leakage. To conclude, the present invention resolve the conflict of prior art in reducing the threshold voltage and in reducing gate-source current leakage, and is able to reduce the threshold voltage and gate-source current leakage at the same time.

The present invention adopts the same defining technique for the hard mask layer for the top trench and the bottom trench, and both have a self-alignment structure, enabling a good alignment for the top trench and the bottom trench with no extra etching work, and thus the present invention has a low cost.

In addition, the shield polysilicon of the present invention is formed by superposing the bottom shield polysilicon with the top shield polysilicon. Generally speaking, a trench formed via superposing a bottom trench with a top trench has a greater depth, and thus, in contrast to a one-time polysilicon filling of a deep trench, the present invention realizes a better effect by means of two fillings of polysilicon in a deep trench, and the shield polysilicon has a better quality. Further, as the polysilicon gate and the bottom shield polysilicon are formed by means of the same polysilicon deposition, the filling of polysilicon in the shield polysilicon at two times incurs no extra process cost.

BRIEF DESCRIPTION OF THE DRAWINGS

In combination with the drawings and embodiments hereunder provided, the present invention will be expounded in more details.

EMBODIMENTS

Figure 1A:
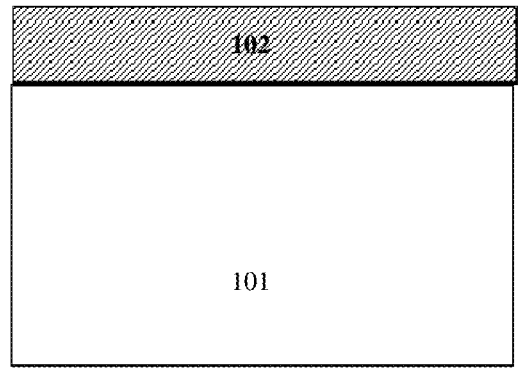
FIGS. 1A-1N show schematic diagrams of related components in the steps of a prior art method for fabricating a shield gate trench MOSFET.
Figure 1B:
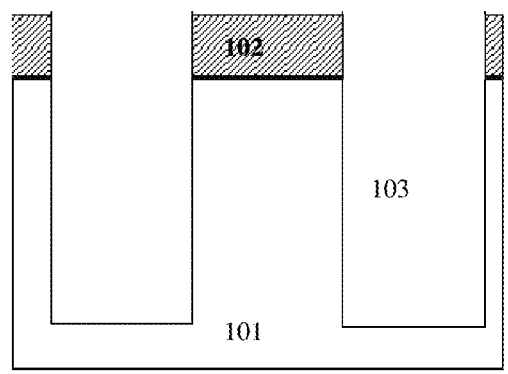
Figure 1C:
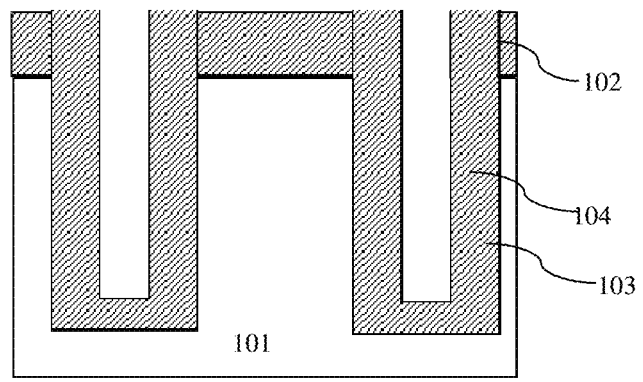
Figure 1D:
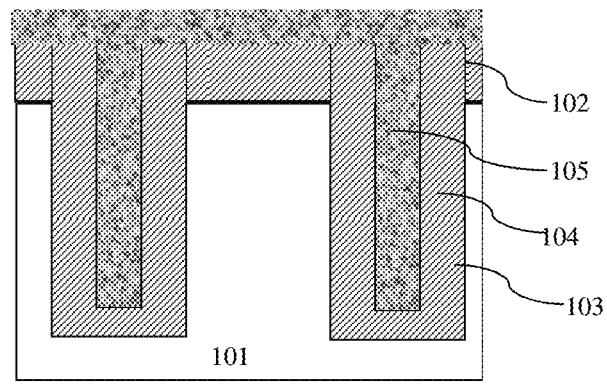
Figure 1E:
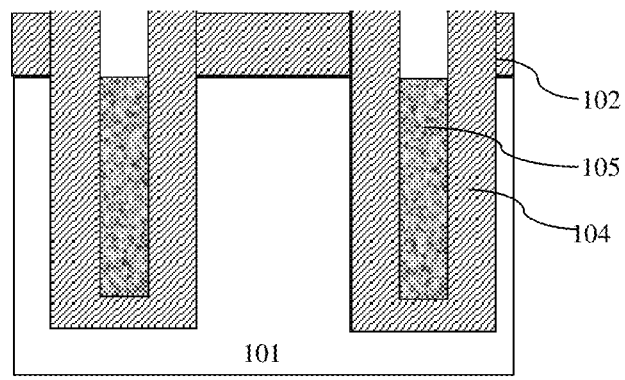
Figure 1F:
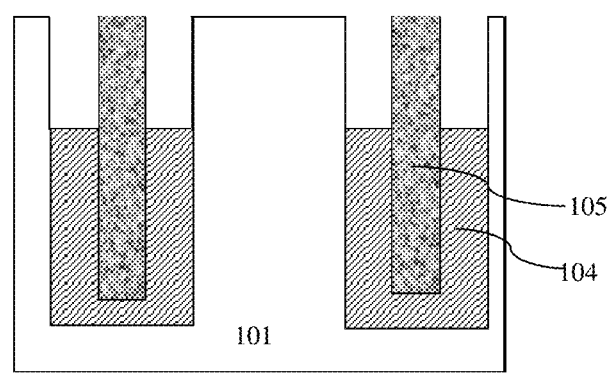
Figure 1G:
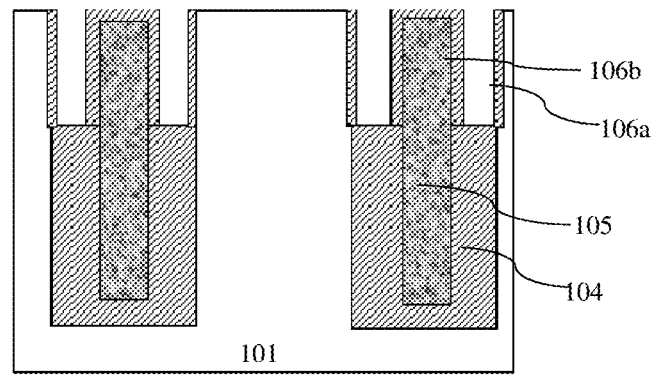
Figure 1H:
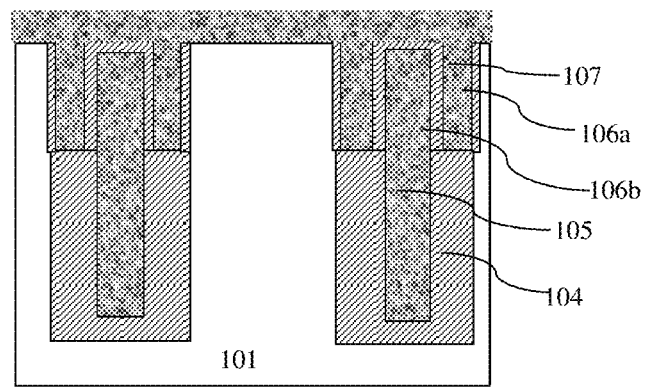
Figure 1I:
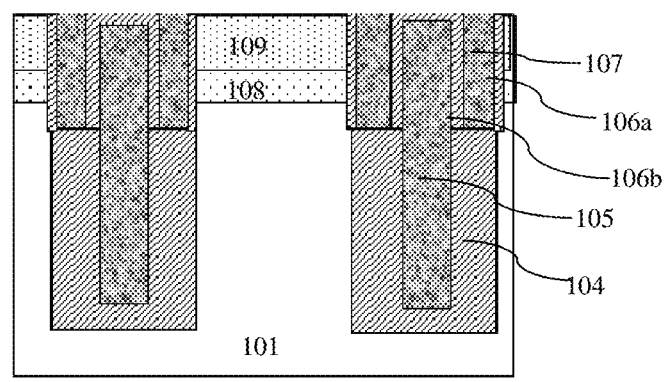
Figure 1J:
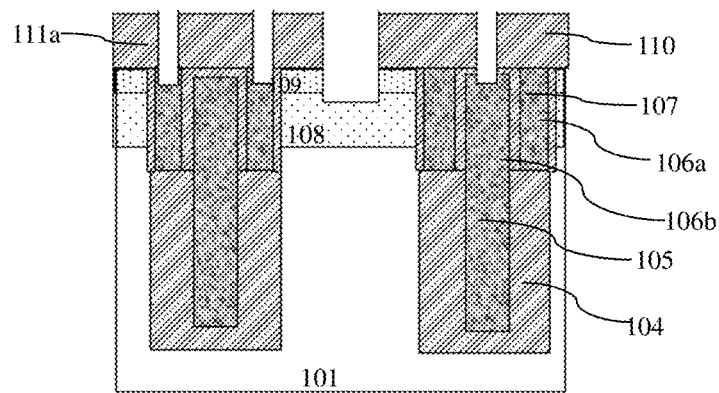
Figure 1K:
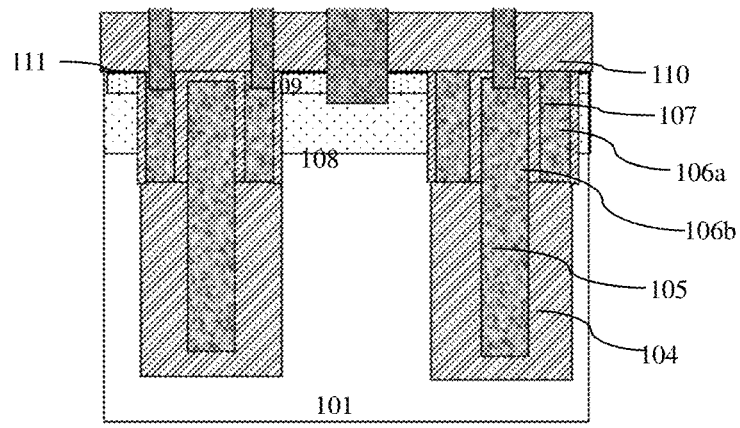
Figure 1L:
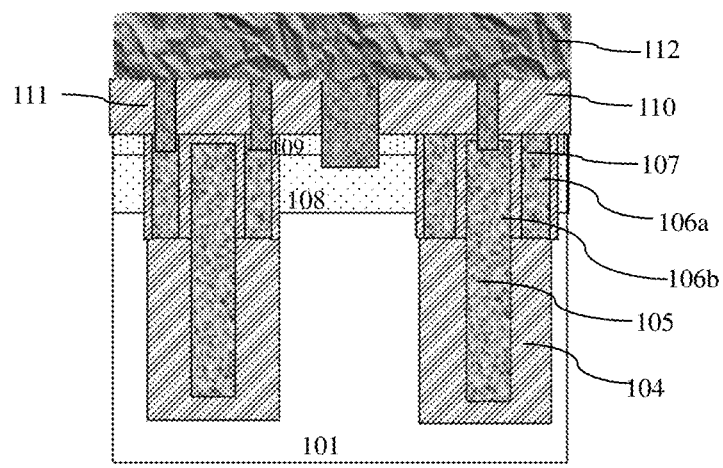
Figure 1M:
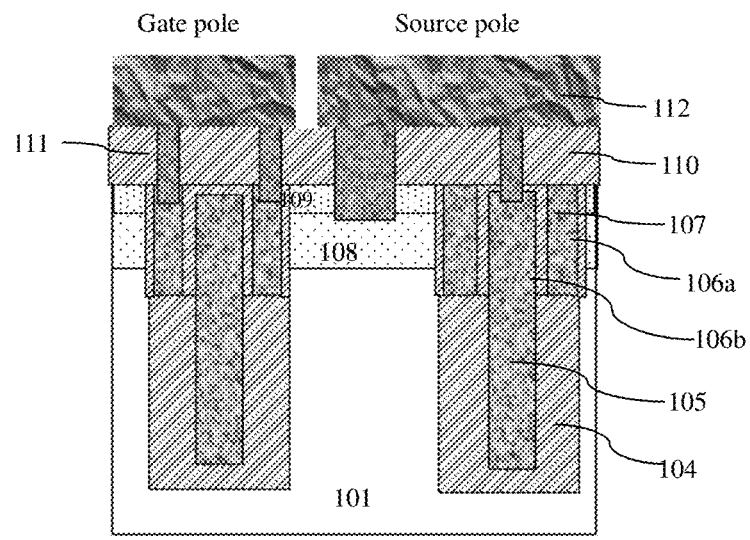
Figure 1N:
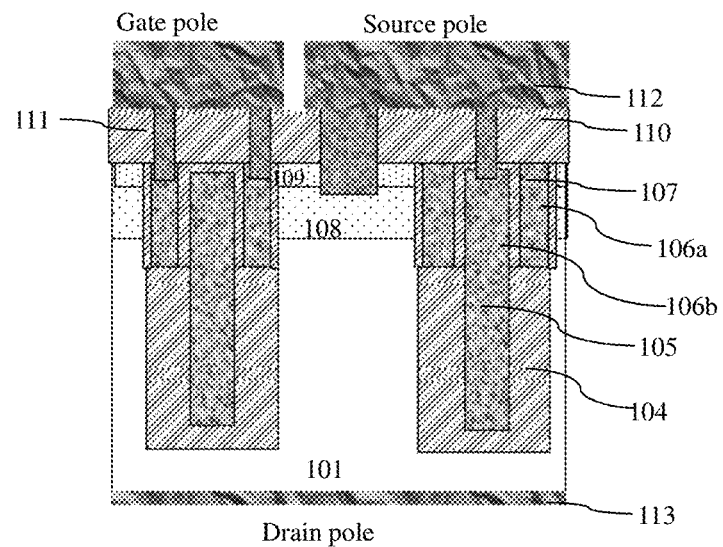
Figure 2:
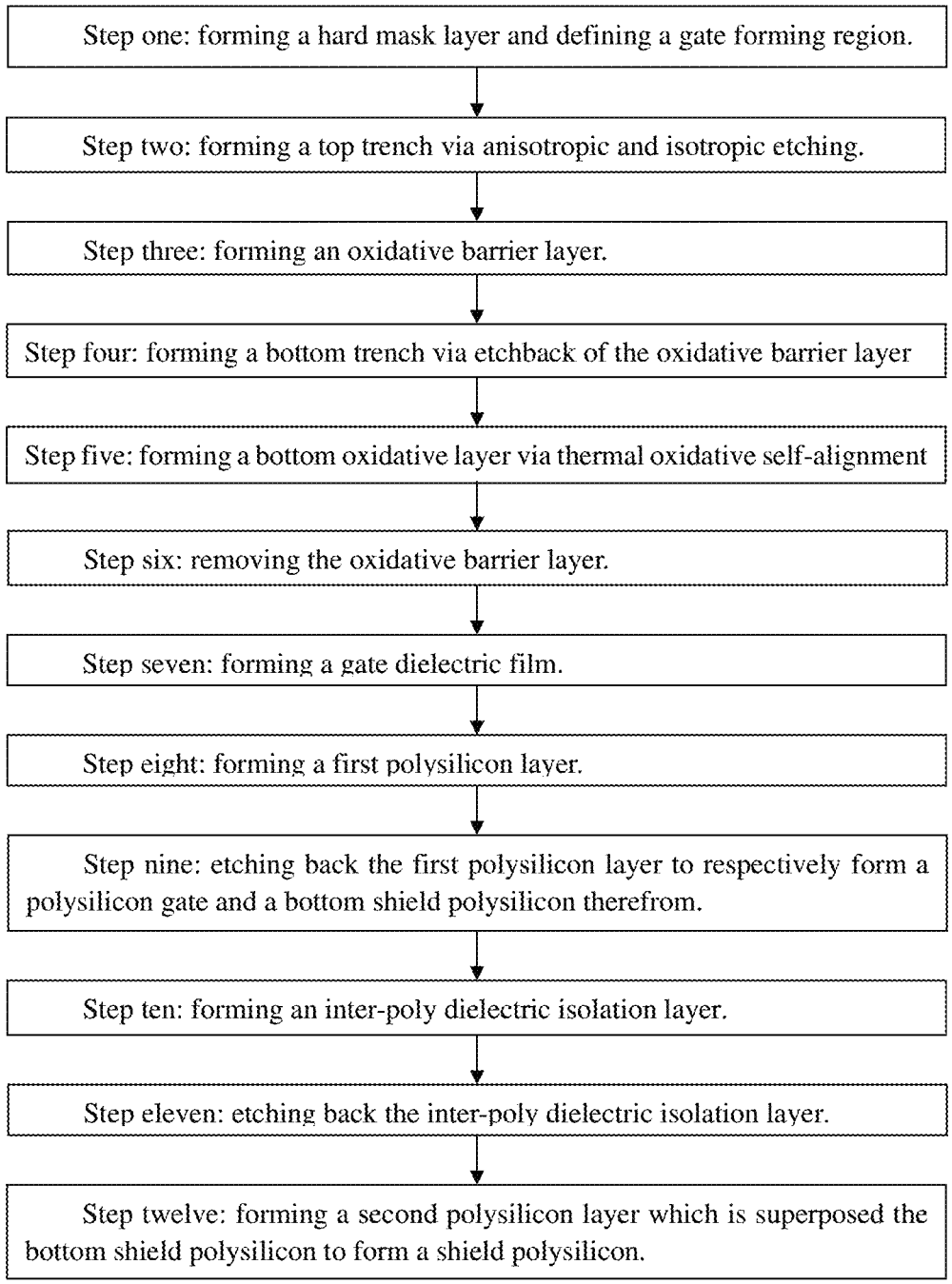
FIG. 2 shows a flow chart of a method of embodiment of the present invention.
Figure 3A:
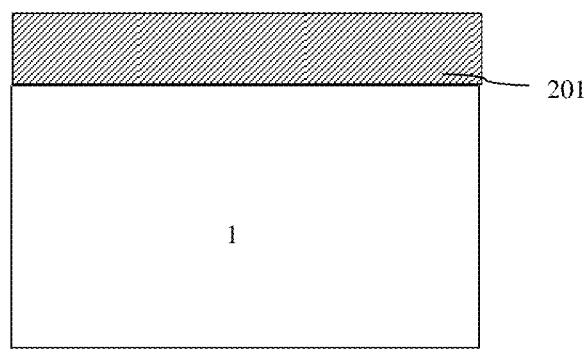
FIGS. 3A-3T show schematic diagrams of related components in the steps of the embodiment method of the present invention for fabricating a shield gate trench MOSFET.

FIG. 2 shows a flow chart of the embodiment method of the present invention; FIGS. 3A-3T show schematic diagrams of related components in the steps of the embodiment method of the present invention for fabricating a shield gate trench MOSFET. The gate structure for the embodiment method of the present invention for fabricating a shield gate trench MOSFET is formed by means of the following steps:

Step one: providing a semiconductor substrate 1, forming a hard mask layer 201 on a surface of the semiconductor substrate 1, as is shown on FIG. 3A.

In an embodiment of the present invention, the semiconductor substrate 1 is a silicon substrate, with a silicon epilayer being formed on a surface of the silicon substrate, and the top trench 202 and the bottom trench 205 subsequently formed are all situated inside the silicon epilayer.

The hard mask layer 201 is composed of an oxidative layer.

Figure 3B:
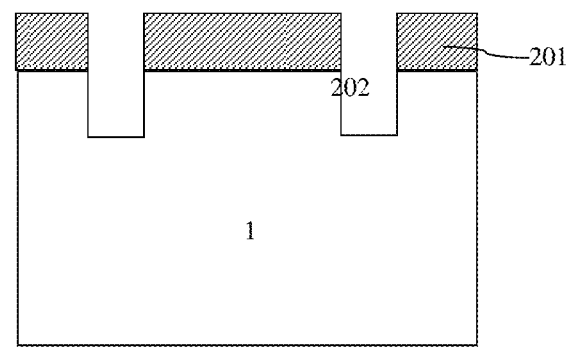

Defining a gate forming region by means of lithography, and removing the hard mask layer 201 in the gate forming region by means of etching, as is shown on FIG. 3B.

Step two: with the etched hard mask layer 201 as a mask, conducting a first etching, which being an anisotropic one, on the semiconductor substrate 1 to form a top trench 202, as is shown on FIG. 3B.

Figure 3C:
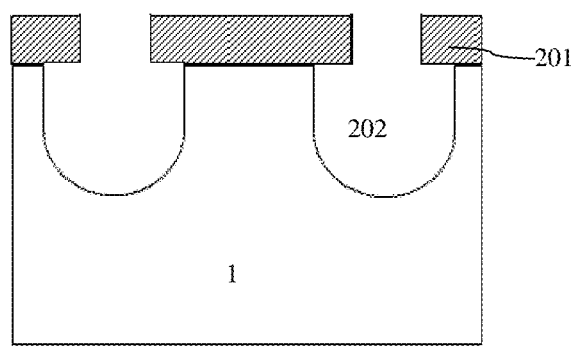

And subsequently conducting a second etching, which being an isotropic one, on the semiconductor substrate 1, to render a width of the top trench 202 to be greater than an opening width defined by the hard mask layer 201, as is shown on FIG. 3C.

Figure 3D:
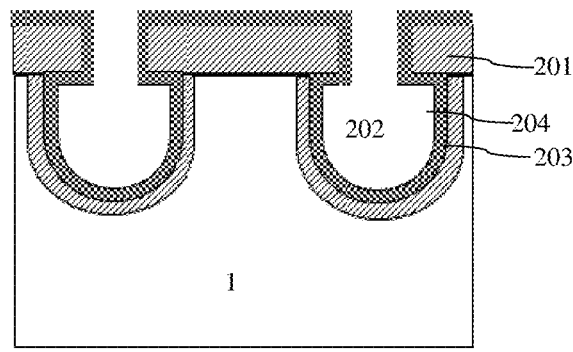

Step three: forming an oxidative barrier layer on an inner side surface of the top trench 202, and extending the oxidative barrier layer to a surface of the hard mask layer exterior to the top trench 202, as is shown on FIG. 3D.

In an embodiment of the present invention, the oxidative barrier layer is composed of a first oxidative layer 203 and a second nitride layer 204 being successively superposed.

Figure 3E:
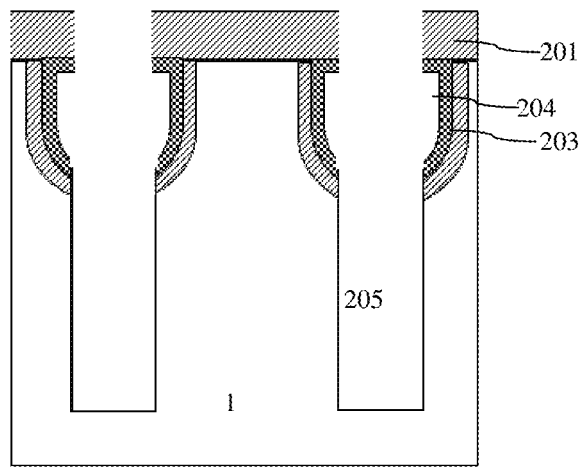

Step four: as shown in FIG. 3E, etching back the oxidative barrier layer to remove the oxidative barrier layer on a surface of a bottom of the top trench 202 and on the surface of the hard mask layer 201 exterior to the top trench 202, with the oxidative barrier layer on the side surface of the top trench 202 remaining intact.

With the hard mask layer 201 as a mask, conducting a third etching, which being an anisotropic one, on the semiconductor substrate 1 on the bottom of the top trench 202 to form a bottom trench 205.

Figure 3F:
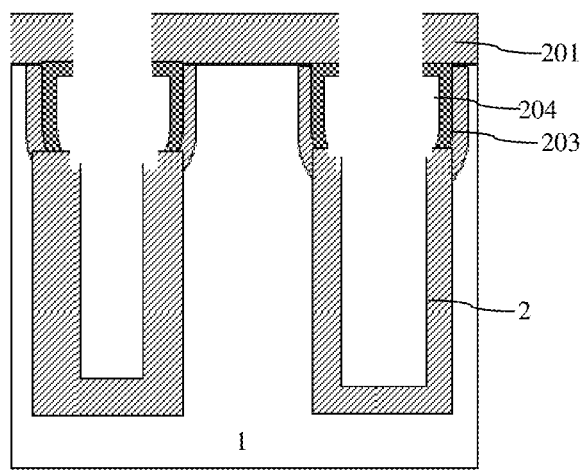

Step five: conducting thermal oxidation on a bottom surface and a side surface of the bottom trench 205 to form a bottom oxidative layer 2 by means of self-alignment, with the oxidative barrier layer protecting the semiconductor substrate 1 on the side surface of the top trench 202 during the entire process of the thermal oxidation of the bottom oxidative layer 2, as is shown on FIG. 3F.

Figure 3G:
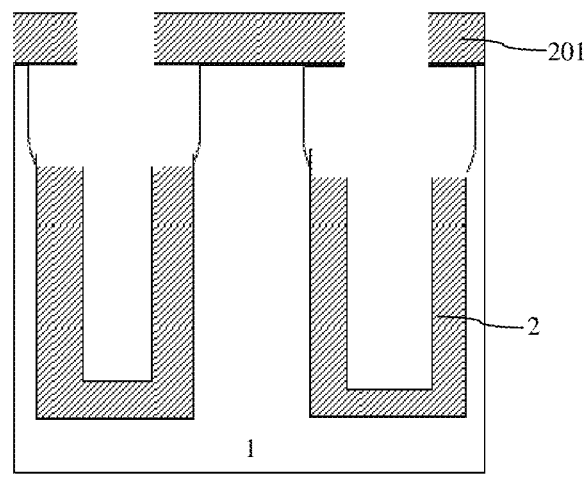

Step six: removing the oxidative barrier layer, as is shown on FIG. 3G.

Figure 3H:
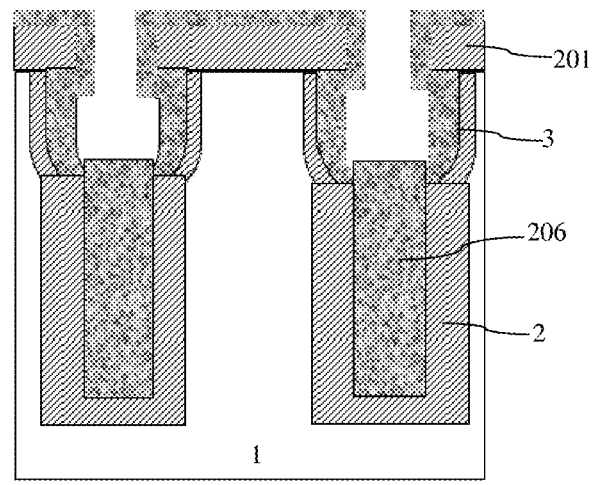

Step seven: forming a gate dielectric film 3 on the side surface of the top trench 202, as is shown on FIG. 3H.

In an embodiment of the present invention, the gate dielectric film 3 is a gate oxide. Preferably, the gate oxide is formed by means of thermal oxidation.

Step eight: conducting a first polysilicon growth to form a first polysilicon layer 206 for completely filling in the bottom trench 205 formed with the bottom oxidative layer 2, the first polysilicon layer 206 in the top trench 202 being situated in a side surface of the gate dielectric film 3, with the first polysilicon layer 206 respectively on either side of the top trench 202 having a distance one with another, and the first polysilicon layer 206 being extended to the surface of the hard mask layer 201 exterior to the top trench 202, as is shown on FIG. 3H.

Figure 3I:
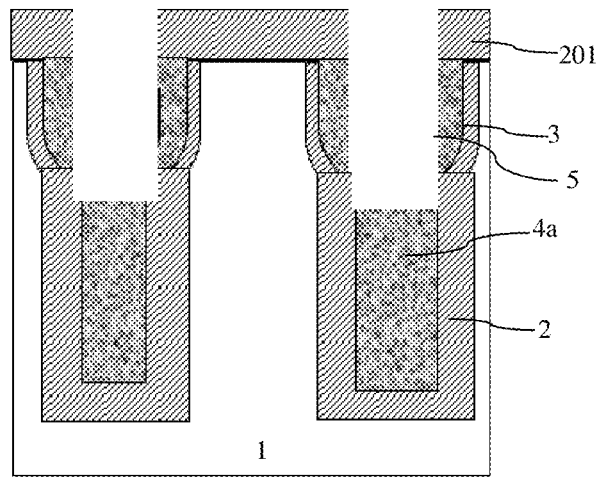

Step nine: conducting an etchback on the first polysilicon layer 206, with the etchback rendering the first polysilicon layer 206 on the bottom trench 205 to be lower than a top of the bottom oxidative layer 2 and removing at the same time the first polysilicon layer 206 exterior to the top trench 205, the portion of the first polysilicon layer 206 on either side of the top trench 202 subsequent to the etchback constituting a polysilicon gate 5, and the first polysilicon layer 206 filling in the bottom trench 205 subsequent to the etchback constituting a bottom shield polysilicon 4a, as is shown on FIG. 3I.

Figure 3J:
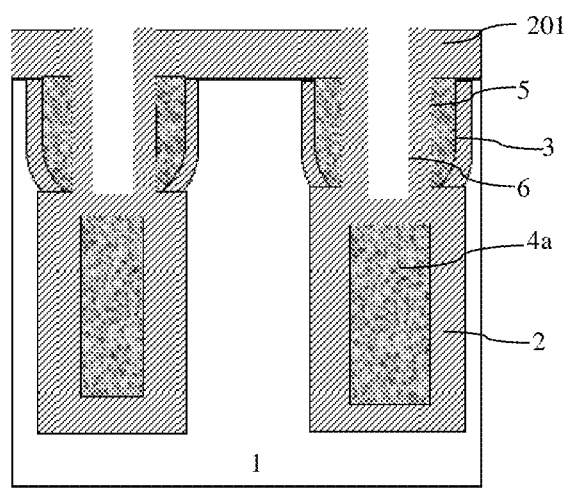

Step ten: forming a inter-poly dielectric isolation layer 6 which is formed on a side surface of the polysilicon gate 5 and on a surface of the bottom shield polysilicon 4a and is extended to the surface of the hard mask layer 201 exterior to the top trench 202, as is shown on FIG. 3J.

In an embodiment of the present invention, the inter-poly dielectric isolation layer 6 is composed of another oxidative layer. Preferably, the inter-poly dielectric isolation layer 6 is formed by means of thermal oxidation.

Figure 3K:
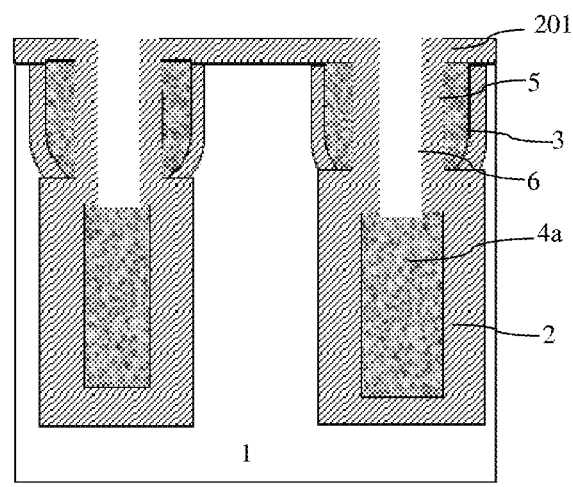

Step eleven: etching back the inter-poly dielectric isolation layer 6 for removing the inter-poly dielectric isolation layer 6 on the surface of the bottom shield polysilicon 4a, as is shown on FIG. 3K.

Figure 3L:
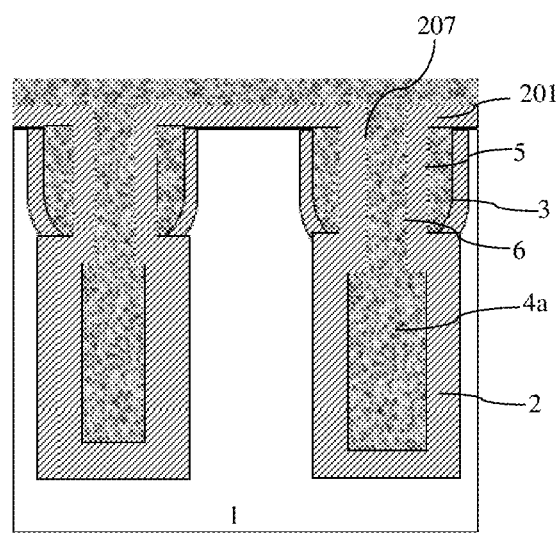

Step twelve: conducting a second polysilicon growth to form a second polysilicon layer 207 which completely fills in the top trench in a top of the bottom shield polysilicon 4a and constitutes a top shield polysilicon 4b, as is shown on FIG. 3L.

Figure 3M:
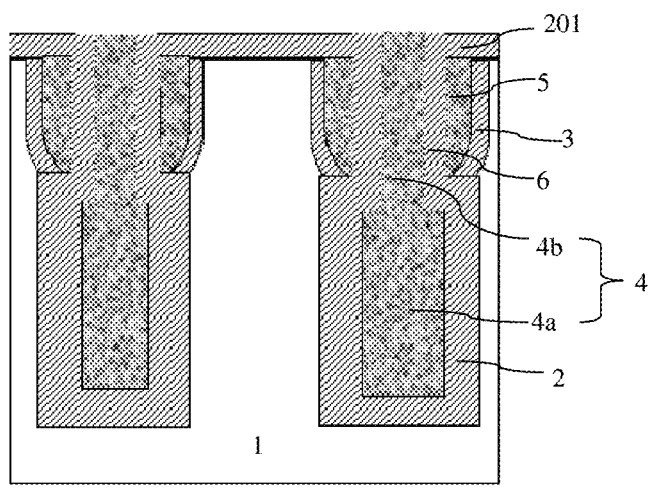

Step thirteen: removing the second polysilicon layer 207 exterior to the top trench via polysilicon etchback, the top shield polysilicon 4b and the bottom shield polysilicon 4a are in contact with one another and constitute a shield polysilicon 4, as is shown on FIG. 3M.

Figure 3N:
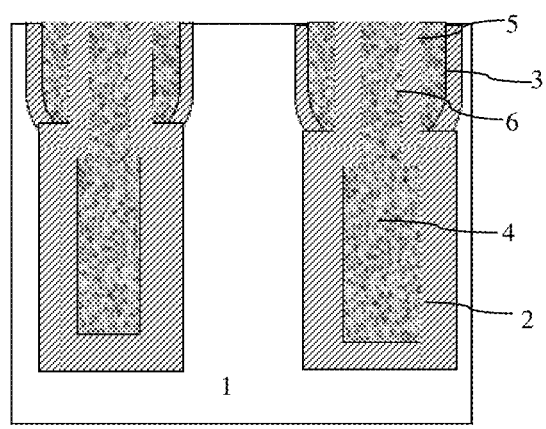

The inter-poly dielectric isolation layer 6 and the hard mask layer are both removed and the surface of the semiconductor substrate 1 is exposed, as is shown on FIG. 3N.

Figure 3O:
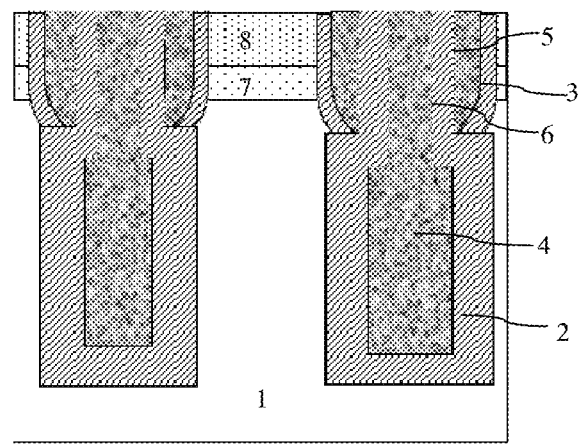

Step fourteen: injecting ions to form a well region 7 in the semiconductor substrate 1; conducting heavily doped source ion implantation to form a source region 8 on a surface of the well region 7; conducting thermal annealing on the well region 7 and the source region 8, as is shown on FIG. 3O.

Figure 3P:
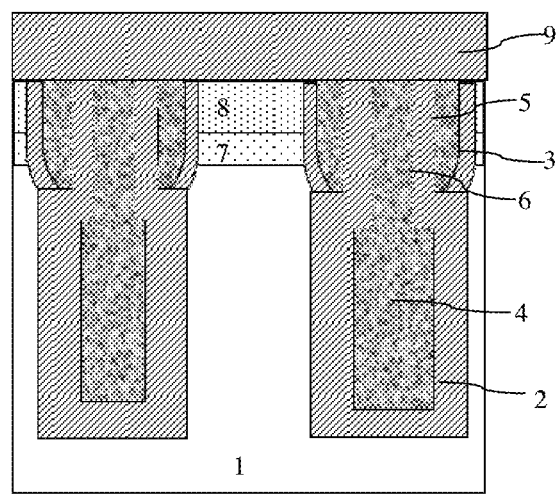

Step fifteen: forming an interlayer film 9 on the positive side of the semiconductor substrate 1, as is shown on FIG. 3P.

Figure 3Q:
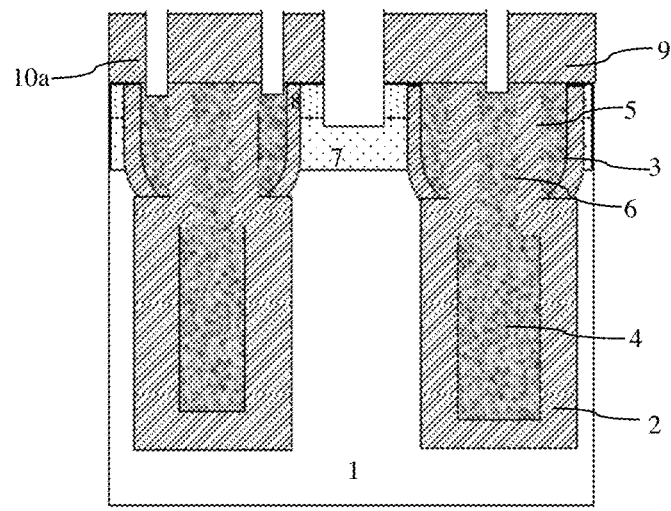

Forming a contact hole 10a which passes through the interlayer film 9 via etching, wherein the reference sign 10a represents the contact hole prior to filling in of a metal, as is shown on FIG. 3Q.

Preferably, subsequent to forming an opening of the contact hole 10a and prior to filling in the metal, the method further comprises a step of forming a well region contact region by means of heavy doping on a bottom of the contact hole 10a in contact with the source region 8.

Figure 3R:
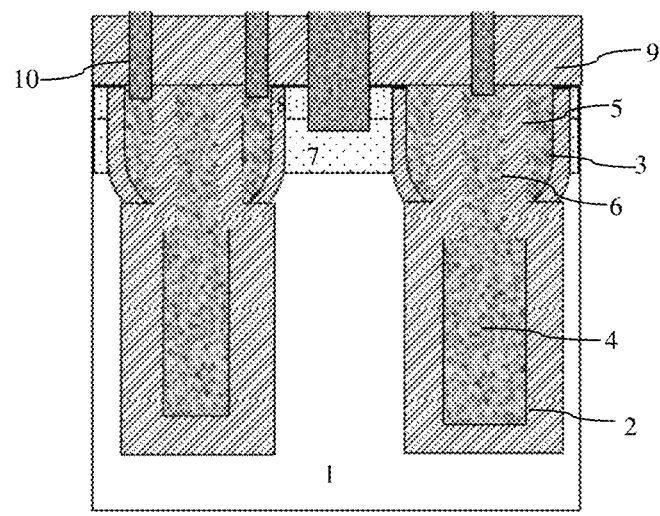

Filling in the metal in the contact hole 10a, with the contact hole being represented with the reference sign 10 subsequent to filling in of the metal, as is shown on FIG. 3R.

Figure 3S:
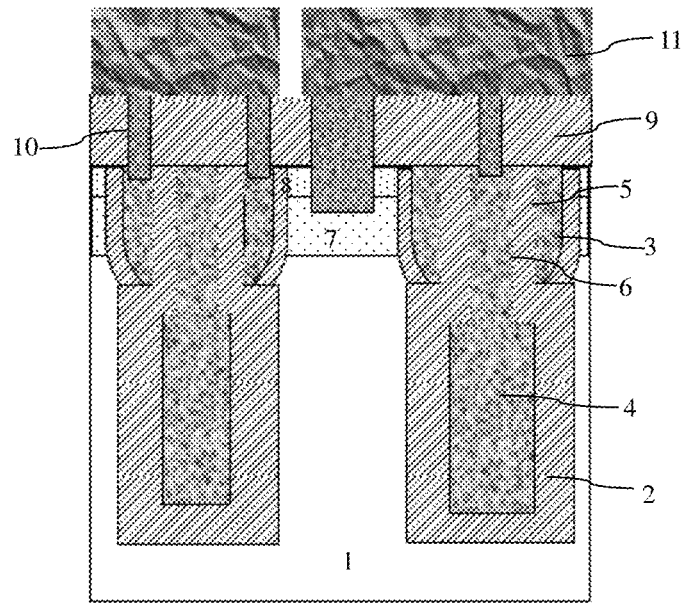
Figure 3T:
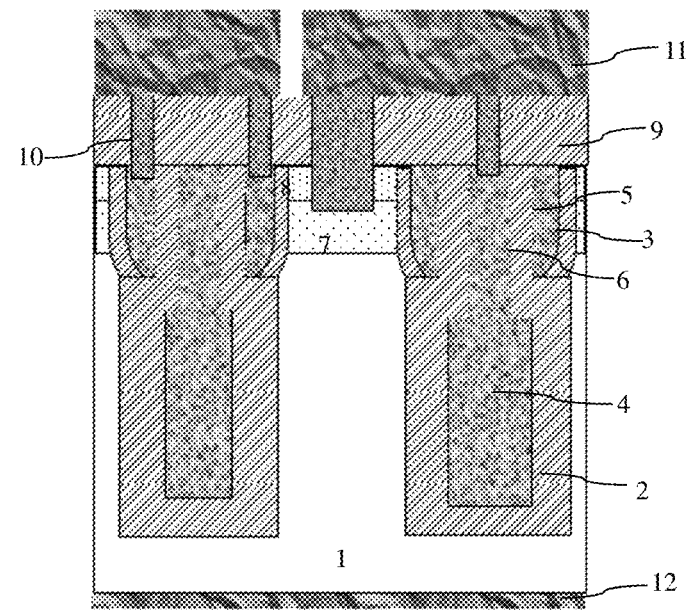

Forming a positive metal layer 11, etching the positive metal layer 11 to form a source pole and a gate pole, the source pole being in contact with the source region 8 and the shield polysilicon 4 via the contact hole 10, and the gate pole being in contact with the polysilicon gate 5 via the contact hole 10, as is shown on FIG. 3S.

Step sixteen: thinning a reverse side of the semiconductor substrate 1, forming a heavily doped drain region, and forming a reverse metal layer 12 on a reverse side of the drain region as a drain pole, as is shown on FIG. 3T.

The gate structure of the present invention is formed via a top-down process, with the top trench 202, and then the bottom trench being firstly formed, subsequently the bottom oxidative layer 2 and the gate dielectric film 3 are successively formed, with the first polysilicon layer 206 being deposited and etched back simultaneously, and the polysilicon gate 5 and the bottom shield polysilicon 4a are formed at the same time, and finally the inter-poly dielectric isolation layer 6 and the top shield polysilicon 4b are formed, with the shield polysilicon being formed by means of superposing the bottom shield polysilicon 4a with the top shield polysilicon 4b. Thus it can be readily seen that the gate dielectric film 3 and the inter-poly dielectric isolation layer 6 of the present invention are separately formed, the thickness of the gate dielectric film and that of the inter-poly dielectric isolation layer are independent one of the another, and hence the present invention is able to reduce the thickness of the gate dielectric film 3 to obtain a low threshold voltage appliance, and is also able at the same time to increase the thickness of the inter-poly dielectric isolation layers 6 to reduce gate-source current leakage. To conclude, the embodiment method of the present invention resolves the conflict of prior art in reducing the threshold voltage and in reducing gate-source current leakage, and is able to reduce the threshold voltage and gate-source current leakage at the same time.

TABLE ONE

| Method for fabricating a shield gate trench MOSFET | Thickness of the gate oxide (Å) | Inter-poly dielectric isolation layer (Å) | Gate-source current leakage @20 V(A) |
|---|---|---|---|
| Prior art | 450 | 675 (formed from polysilicon via oxidation at the same time the gate oxide is formed) | 5E-7 |
| Embodiment method of the present invention | 450 | 2000 (thickness is selective) | 1E-9 |

Table One compares the gate-source current leakage of the bottom up prior art method with that of the top down embodiment method of the present invention. The gate dielectric films of both methods adopt gate oxide and are both formed by means of thermal oxidation. For convenience of comparison, thickness for either method is 450 Å. For the prior art method, the inter-poly dielectric isolation layer and the gate oxide are formed by means of the same oxidation process, and as the inter-poly dielectric isolation layer is formed from polysilicon via oxidation, its thickness will be greater than 450 Å, which is 675 Å on Table One; as for the embodiment method of the present invention, formation of the inter-poly dielectric isolation layer is no longer restricted to the process for forming a gate oxide, and thus its thickness is selective, which is 2000 Å on Table One. Subsequent gate-source current leakage measurement shows that at a voltage of 20 v, the gate-source current leakage from a prior art appliance is 5E-7A, while that from an appliance formed by means of the embodiment method of the present invention is 1E-9A. It shows that the gate-source current leakage of an appliance formed by means of the prior art bottom up method is 500 times greater than that of an appliance formed by means of the embodiment method of the present invention.

The top trench 202 and the bottom trench 205 of the embodiment method of the present invention both adopt the same defining technique for the hard mask layer 201, and both have a self-alignment structure, enabling a good alignment for the top trench 202 and the bottom trench 205 with no extra etching work, and thus the embodiment method of the present invention has a low cost.

In addition, the shield polysilicon 4 of the embodiment method of the present invention is formed by superposing the bottom shield polysilicon 4a with the top shield polysilicon 4b. Generally speaking, a trench formed via superposing a bottom trench 205 with a top trench 202 has a greater depth, and thus, in contrast to a one-time filling of a deep trench, the embodiment method of the present invention realizes a better filling effect by means of two fillings of polysilicon in a deep trench, and the shield polysilicon 4 has a better quality. Further, as the polysilicon gate 5 and the bottom shield polysilicon 4a are formed by means of the same polysilicon deposition, the filling of polysilicon in the shield polysilicon 4 in two times incurs no extra cost.

The present invention has thus been enunciated in full details with specific embodiments, but is not meant to be limited thereby. A person of the art, without departure from the principle of the present invention, shall be able to make various modifications and improvements thereto, which shall fall within the scope of protection of the present invention.

What is claimed is:

1. A method for fabricating a shield gate trench metal-oxide semiconductor field-effect transistor (MOSFET), comprising the following steps for forming a gate structure thereof:

step one: providing a semiconductor substrate, forming a hard mask layer on a surface of the semiconductor substrate, defining a gate forming region by means of lithography, and removing the hard mask layer in the gate forming region by means of etching;

step two: with the etched hard mask layer as a mask, conducting a first etching, which being an anisotropic one, on the semiconductor substrate to form a top trench, and subsequently conducting a second etching, which being an isotropic one, on the semiconductor substrate, to render a width of the top trench to be greater than an opening width defined by the hard mask layer;

step three: forming an oxidative barrier layer on an inner side surface of the top trench, and extending the oxidative barrier layer to a surface of the hard mask layer exterior to the top trench;

step four: etching back the oxidative barrier layer to remove the oxidative barrier layer on a surface of a bottom of the top trench and on the surface of the hard mask layer, with the oxidative barrier layer on the side surface of the top trench remaining intact;

with the hard mask layer as a mask, conducting a third etching, which being an anisotropic one, on the semiconductor substrate on the bottom of the top trench to form a bottom trench;

step five: conducting thermal oxidation on a bottom surface and a side surface of the bottom trench to form a bottom oxidative layer by means of self-alignment, with the oxidative barrier layer protecting the semiconductor substrate on the side surface of the top trench during an entire process of the thermal oxidation of the bottom oxidative layer;

step six: removing the oxidative barrier layer;

step seven: forming a gate dielectric film on the side surface of the top trench;

step eight: conducting a first polysilicon growth to form a first polysilicon layer for completely filling in the bottom trench formed with the bottom oxidative layer, the first polysilicon layer in the top trench being situated in a side surface of the gate dielectric film, with the first polysilicon layer respectively on either side of the top trench having a distance one with another, and the first polysilicon layer being extended to the surface of the hard mask layer exterior to the top trench;

step nine: conducting an etchback on the first polysilicon layer, with the etchback rendering the first polysilicon layer on the bottom trench to be lower than a top of the bottom oxidative layer and removing at the same time the first polysilicon layer exterior to the top trench, the portion of the first polysilicon layer on either side of the top trench subsequent to the etchback constituting a polysilicon gate, and the first polysilicon layer filling in the bottom trench subsequent to the etchback constituting a bottom shield polysilicon;

step ten: forming a inter-poly dielectric isolation layer which is formed on a side surface of the polysilicon gate and on a surface of the bottom shield polysilicon and is extended to the surface of the hard mask layer exterior to the top trench;

step eleven: etching back the inter-poly dielectric isolation layer for removing the inter-poly dielectric isolation layer on the surface of the bottom shield polysilicon;

step twelve: conducting a second polysilicon growth to form a second polysilicon layer which completely fills in the top trench in a top of the bottom shield polysilicon and constitutes a top shield polysilicon, and the top shield polysilicon and the bottom shield polysilicon are in contact with one another and constitute a shield polysilicon.

2. The method for fabricating the shield gate trench MOSFET of claim 1, further comprising, subsequent to forming the gate structure, the following steps:

step thirteen: removing the second polysilicon layer, the inter-poly dielectric isolation layer, and the hard mask layer exterior to the top trench, and exposing the surface of the semiconductor substrate;

step fourteen: injecting ions to form a well region in the semiconductor substrate; conducting heavily doped source ion implantation to form a source region on a surface of the well region; conducting thermal annealing on the well region and the source region;

step fifteen: forming an interlayer film, a contact hole and a positive metal layer on a positive side of the semiconductor substrate, etching the positive metal layer to form a source pole and a gate pole, the source pole being in contact with the source region and the shield polysilicon via the contact hole, and the gate pole being in contact with the polysilicon gate via the contact hole;

step sixteen: thinning a reverse side of the semiconductor substrate, forming a heavily doped drain region, and forming a reverse metal layer on a reverse side of the drain region as a drain pole.

3. The method for fabricating the shield gate trench MOSFET of claim 1, wherein the semiconductor substrate is a silicon substrate, with a silicon epilayer being formed on a surface of the silicon substrate, and the top trench and the bottom trench are all situated inside the silicon epilayer.

4. The method for fabricating the shield gate trench MOSFET of claim 1, wherein the hard mask layer in step one is composed of an oxidative layer.

5. The method for fabricating the shield gate trench MOSFET of claim 1, wherein the oxidative barrier layer in step three is composed of a first oxidative layer and a second nitrite layer being successively superposed.

6. The method for fabricating the shield gate trench MOSFET of claim 1, wherein the gate dielectric film in step seven is a gate oxide.

7. The method for fabricating the shield gate trench MOSFET of claim 6, wherein the gate oxide is formed by means of thermal oxidation.

8. The method for fabricating the shield gate trench MOSFET of claim 1, wherein the inter-poly dielectric isolation layer in step ten is composed of another oxidative layer.

9. The method for fabricating the shield gate trench MOSFET of claim 8, wherein the inter-poly dielectric isolation layer is formed by means of thermal oxidation.

10. The method for fabricating the shield gate trench MOSFET of claim 2, wherein step fifteen, subsequent to forming an opening of the contact hole and prior to filling in a metal, further comprises a step of forming a well region contact region by means of heavy doping on a bottom of the contact hole in contact with the source region.

* * * * *